United States Patent [19]
Gallagher

[11] Patent Number: 5,262,588
[45] Date of Patent: Nov. 16, 1993

[54] ELECTROMAGNETIC INTERFERENCE/RADIO FREQUENCY INNTERFERENCE SEAL

[75] Inventor: Robert M. Gallagher, Poughkeepsie, N.Y.

[73] Assignee: International Business Machines Corporation, Armonk, N.Y.

[21] Appl. No.: 49,688

[22] Filed: Apr. 16, 1993

Related U.S. Application Data

[63] Continuation of Ser. No. 817,551, Jan. 7, 1992, Pat. No. 5,214,242.

[51] Int. Cl.$^5$ .............................. H05K 9/00
[52] U.S. Cl. .................... 174/35 R; 361/818
[58] Field of Search .......... 174/35 GC, 35 R, 35 MS; 361/424; 428/40-42; 219/10.55 R, 10.55 D

[56] References Cited

U.S. PATENT DOCUMENTS

| | | | |
|---|---|---|---|
| 4,495,232 | 1/1985 | Bauser et al. | 428/41 |
| 4,507,359 | 3/1985 | Powers, Jr. | 428/328 |
| 4,942,380 | 7/1990 | Bradford et al. | 335/301 |
| 4,972,765 | 11/1990 | Dixon | 98/2.18 |
| 4,977,296 | 12/1990 | Hemming | 174/35 MS |
| 4,988,550 | 1/1991 | Keyser et al. | 428/40 |

FOREIGN PATENT DOCUMENTS

| | | |
|---|---|---|
| 399944 | 11/1990 | European Pat. Off. |
| 6123673 | 6/1986 | Japan |
| 0240179 | 12/1990 | Japan |

OTHER PUBLICATIONS

IBM Technical Disclosure Bulletin, vol. 14, No. 2, Jul. 1971, p. 518 by Herel et al. Adhesively Fastened EMC Contact Strips.
IBM Technical Disclosure Bulletin, vol. 14, No. 2, Jul. 1971, p. 474 by Damm et al Adhesive Conducting Tape for EMC Closures.

*Primary Examiner*—Leo P. Picard
*Assistant Examiner*—Bot L. Ledynh
*Attorney, Agent, or Firm*—Lawrence D. Cutter; Floyd A. Gonzalez

[57] ABSTRACT

An aluminum foil strip is provided with adhesive strips on one face surrounding the strip of foil. The strip of foil is then positionable and attachable to an electronic cabinet frame over exposed raw metal areas for intimate electrical contact when the cabinet door is closed. This strip of foil provides electrical continuity between the frame and door as well as a seal against EMI/RFI at the cabinet/door interface.

5 Claims, 2 Drawing Sheets

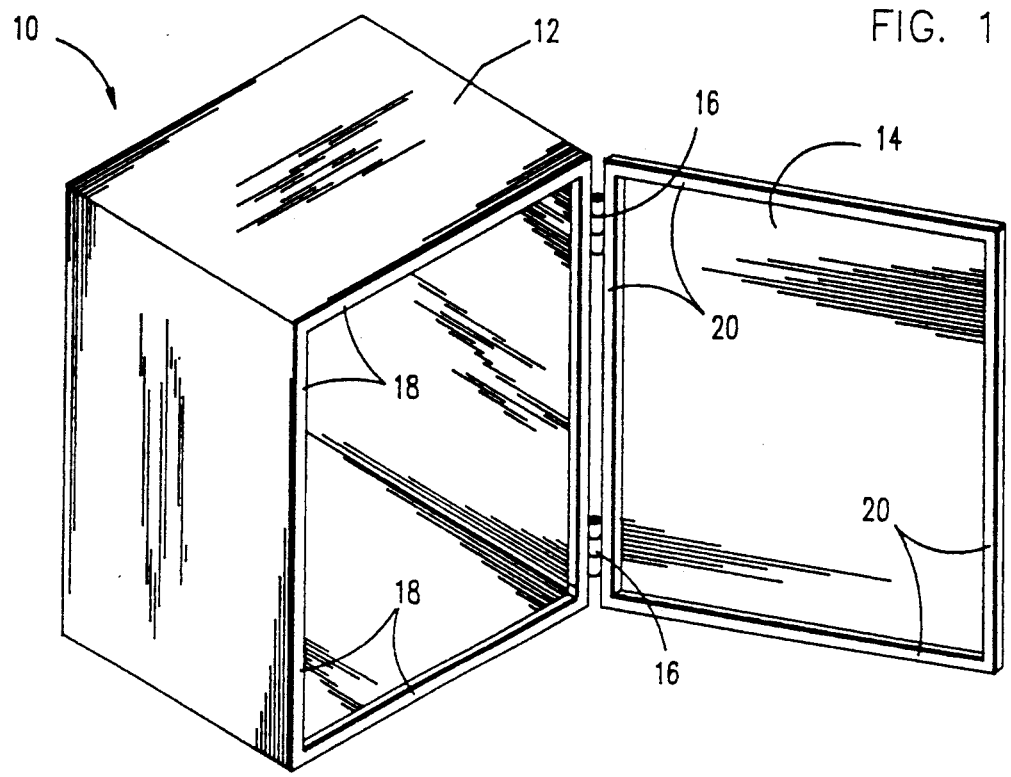
FIG. 1
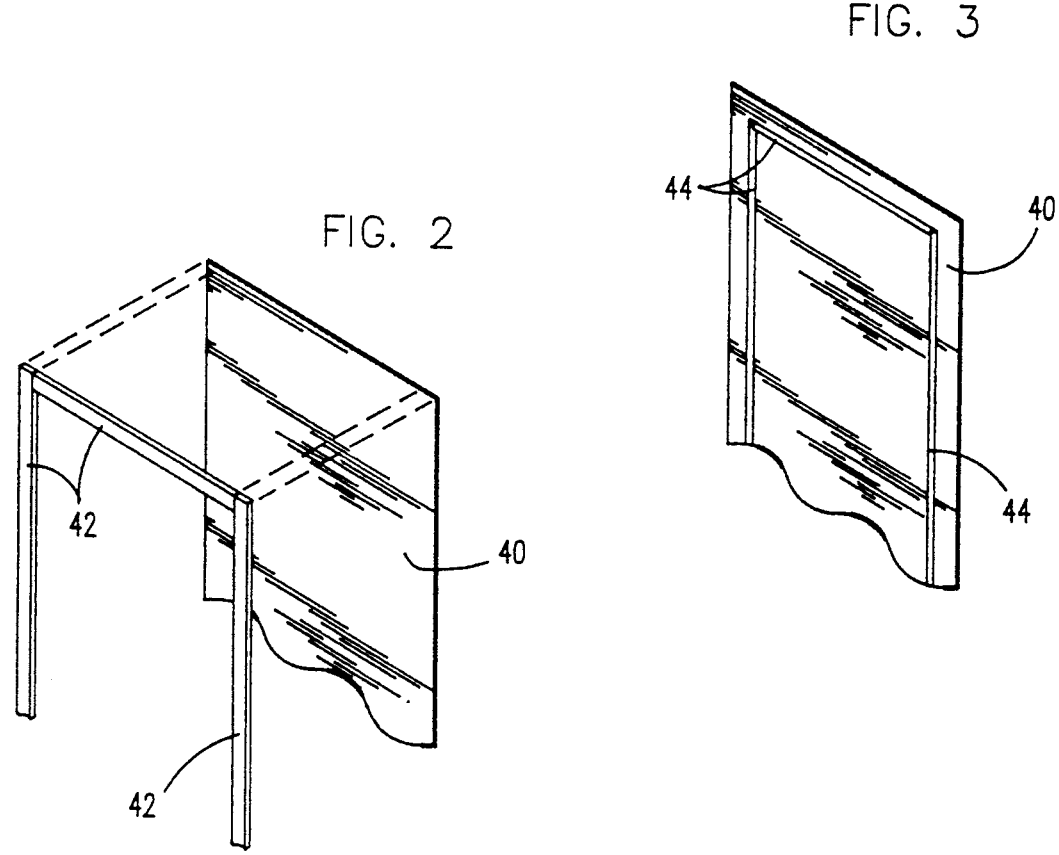
FIG. 2
FIG. 3

ELECTROMAGNETIC INTERFERENCE/RADIO FREQUENCY INNTERFERENCE SEAL

This application is a continuation of application Ser. No. 07/817,551, filed Jan. 7, 1992, now U.S. Pat. No. 5,214,242.

FIELD OF THE INVENTION

This invention relates to techniques for electrically interconnecting the movable portions of an electronic systems cabinet or container with the fixed portions of the cabinet or container and more specifically, to the material and device used for electrically interconnecting of the two portions of the cabinet.

BACKGROUND OF THE INVENTION

High performance electronic equipment such as computers and particularly the processor portion of a computer must be shielded from radio frequency interference and from electromagnetic interference in order to reliably operate. Electromagnetic interference/radio frequency interference (EMI/RFI) interferes with the signals on the different lines leading to and from the computer and within the computer processor itself, since the lines leading to and from the computer act as antennas and an electrical current may be generated in those electrical conductors as a result of being a receiver for EMI/RFI.

In order to protect the electronic device, from the EMI/RFI and to improve its performance, the electronic device is typically enclosed within a metal cabinet which in turn is grounded. The metal cabinet acts as a receiver for the EMI/RFI and the resulting signals generated in the cabinet are then grounded and thereby prevented from effecting the reliable and efficient operation of the electronic system contained therein.

Additionally, the electronics of the electronic system generate EMI/RFI interference. There exists requirements for an EMI/RFI generating device to be equipped with shielding to prevent the propagation of such interference.

Typically, cabinets are a self-contained item having five sides including a bottom, three sides and a top and additionally a door or closure attached on the open side. The top and bottom may contain a perforated sheet to allow for air flow in and out of the cabinet. The cabinet may have a door or closure adjacent to each other, on opposite sides or wherever access is needed to the cabinet.

In order to prevent leakage, either incoming or outgoing, of EMI/RFI through the gap between the cabinet enclosure and the door, many attempts have been made to conductively connect the door and the cabinet and at the same time seal the gap between the two metal pieces. In order to effectively shield the contents of the cabinet from EMI/RFI, the door, in addition to being connected through the hinges, must be efficiently connected electrically to the cabinet itself around the opening to the cabinet. When a large system computer cabinet frame is assembled, for example, it is painted with a conductive paint to provide a conductive path to ground and also to provide corrosion protection.

Tin plated copper strips with a silver filled conductive pressure sensitive adhesive and a protective strip that may be removed from the adhesive to allow its installation are commercially available. These strips are applied over the bare metal of the frame, typically before, painting. The conductive pressure sensitive adhesive material carried by the tin/copper strips relief upon silver fill material in the conductive pressure sensitive adhesive for conductivity between the frame and the tin plated copper strip. The conductivity of the adhesive can vary with the amount of pressure applied to the adhesive during application.

The cost of this material is exceptionally high due to the silver content. The strip is typically applied to the bare metal of the frame and positioned around the periphery of the opening to the cabinet such that when the door of the cabinet closes and a resilient electrically conductive gasket material carried by the door is engaged in face-to-face contact with the tin plated copper strip, the electrical path between the door through the electrically conductive gasket, the tin plated copper foil and the conductive pressure sensitive adhesive is completed to the bare metal of the frame.

An example of such an electrically conductive tape is found in the IBM Technical Disclosure Bulletin, Vol. 14, No. 2, July, 1971; page 474.

A further example of efforts to address the problem of electromagnetic compatibility, i.e., shielding for EMI, is described and disclosed in the IBM Technical Disclosure Bulletin, Vol. 14, No. 2, July, 1971, page 518.

U.S. Pat. No. 4,977,296 to Hemming, discloses a metal foil with adhesive strips placed parallel to each other along the surface of the metal foil thus causing a ridge/valley contour forming a multiplicity of small wave guides which are effective in attenuating electromagnetic energy by virtue of their physical characteristics. The shielding tape disclosed by Hemming is utilized to join together adjacent panels of shielding material which have been positioned on a fixed wall or structure.

It is an aspect of this invention to be able to establish electrical continuity between the closure of an electronic systems cabinet and the electronic systems cabinet itself.

It is a further aspect of the invention that the continuity between the closure and the frame of the cabinet is not dependent upon a conductive adhesive material, but rather upon highly conductive metal foils.

SUMMARY OF THE INVENTION

An electrically conductive foil of a highly conductive metal is provided with strips of adhesive material or beads of adhesive material in regions approximate the edges of the foil. These beads or strips may then be adhesively engaged, by force or pressure, with the frame of the cabinet which will contain the electronic system or computer. The frame of the cabinet when fabricated and painted, is provided with an exposed raw metal region completely surrounding the opening to the cabinet. The foil and its adhesive are positioned such that one face of the exposed foil, the exposed foil being between the adhesive regions, is positioned directly over the raw metal of the frame which was intentionally left unpainted.

The adhesive acts purely as a holding element to maintain the foil properly positioned in overlying face-to-face relationship with the exposed raw metal region. The foil will be forced into intimate face-to-face contact and thus establish electrical conductivity with the frame when the cabinet door is closed. The cabinet door carries, in electrical continuity with the cabinet material, a gasket which is fabricated of conductive material.

For example, a highly carbon or metallically loaded rubber material may be used as such a gasket. Other synthetic materials may also be used to carry the carbon or metallic particle loading. When the door of the cabinet is closed, the gasket will forcibly engage itself, under compressive forces, with the exposed surface of the foil while at the same time forcing the inner surface of the foil against the raw metal surface of the cabinet frame.

The compressive forces of the gasket onto the foil will establish electrical conductivity between the door or closure of the cabinet and the frame of the cabinet. At the same time, since the foil will extend completely around the opening and will be engaged and compressed between the gasket and the frame at all points, an effective EMI/RFI seal is established.

It can be seen that the shortcomings of the prior art are overcome and the specific aspects of the invention accomplished by the conductive strip and adhesive material described in summary form above.

A better understanding of the invention may be obtained from the drawings and the detailed description of the preferred embodiment below.

DESCRIPTION OF THE DRAWINGS

FIG. 1 is an overall perspective view of a cabinet suitable for mounting an electronic system therein together with a closure door.

FIG. 2 illustrates, in exploded form, one embodiment of the invention comprising adhesive strips applied to the foil to mount the foil on the frame of a cabinet.

FIG. 3 is an alternative embodiment wherein pressure sensitive adhesive material is applied proximate the periphery of the tape permitting the placement of the tape over the exposed metal portions of the frame of the cabinet of FIG. 1.

Figure 4:
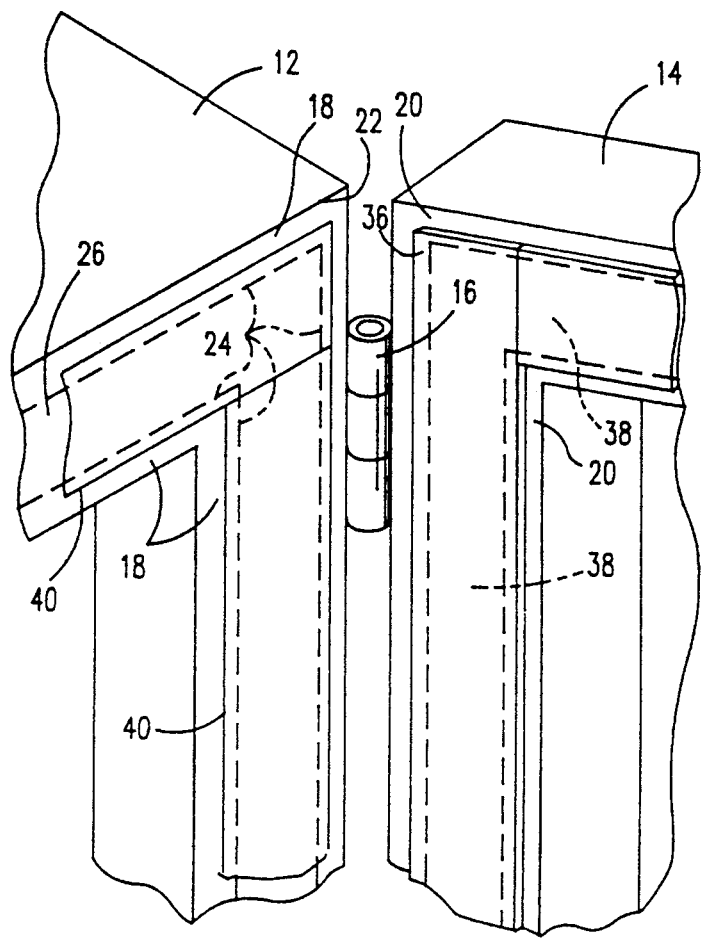
FIG. 4 is an enlarged view of the upper right-hand corner of the frame and opening of the cabinet of FIG. 1 together with the upper left-hand corner of the interior of the closure or door for the cabinet.

DETAILED DESCRIPTION OF THE PREFERRED EMBODIMENT OF THE BEST MODE FOR CARRYING OUT THE INVENTION

Referring now to FIG. 1, cabinet 10 is shown with the cabinet enclosure 12 surrounding a frame 18.

Cabinet 10 is suitable for accepting and containing an electronic system such as a computer. The frame 18 is typically formed of steel such as steel tubing. The cabinet enclosure 12 is preferably sheet metal. The metal sheet of the enclosure 12 is typically painted with a highly conductive paint, as is the frame 18.

For example, the paint may be sprayed onto all surfaces of the structure and then heated to fuse the paint into a continuous protective coating and at the same time, due to its conductive nature, provide conductivity on all surfaces of the enclosure 12 and frame 18.

In order to close the cabinet and to protect the contents from EMI/RFI, a door 14 is provided. The door 14 may likewise by fabricated from sheet metal and may include a frame 20 or, alternatively, the frame 20 may be made by bending and forming the sheet metal of door 14 to provide the frame member 20.

In any event, the door 14 is movably mounted with respect to the cabinet, preferably by use of hinges 16.

As shown in FIG. 1, the only electrical contact and conductive paths between door 14 and frame 18 is through hinge 16 which, at best, is unreliable. When the door 14 is closed, there still is a remaining gap between the frame portion 20 of door 14 and frame 18. Such a gap is typically sufficient to allow undesired quantities of EMI/RFI to enter the cavity of the cabinet 10 and to interfere with the reliable and proper operation of the computer system mounted therein.

Referring now to FIG. 4, it is a preferred embodiment of the best mode for carrying out the invention, that frame 18 is fabricated from a steel material, preferably square or rectangular cross-section tubular steel, and welded together. After the frame 18 has been fabricated and covered with sheet metal 22. The sheet metal 22 is attached to the exterior of frame 18, by any of several conventional ways, such as with screws, bolts or welds.

The sheet metal 22, for example sheet steel, utilized for the exterior surfaces 12 must be preferably highly conductive and act as a partial EMI/RFI shield in and of itself. The exterior sheet metal 22 will be electrically grounded to the frame by conventional attaching techniques, such as bolting, screwing or welding.

The entire structure is typically painted with a conductive paint and may be painted using a liquid or powder type material which is sprayed onto the surfaces and then heated to a temperature causing it to fuse into a continuous protective coating on the metal as well as a continuous electrically conductive shield on the metal. During the painting step, an unpainted region 26, which is defined by boundaries 24 in FIG. 4, is provided by masking that region prior to painting. Masking can be accomplished in many different ways, but a preferred method is to use a strip of magnetic rubber material which will magnetically adhere to the frame 18 and prevent the paint from reaching region 26.

Once the painting has occurred and prior to firing, the magnetic strips may be removed exposing the raw steel of the frame 18.

The unpainted region 26 then becomes the major contact and electrical continuity point for the completion of the EMI/RFI shield.

The cabinet 10 is closed with a door 14 which may be mounted on the cabinet frame 18 by any conventional means such as, for example, hinge 16.

The door 14 is made of an electrically conductive sheet metal which may contain a frame member 20 or preferably may be fabricated by means of bending and joining the sheet metal of the door 14. This frame 20 provides rigidity to the door and at the same time provides a mounting surface for an electrically conductive gasket 36. Electrically conductive gasket 36 is attached to the bare metal on the door 14. The bare raw metal region 38 of the door 14 is left exposed during the painting process in the same manner that the unpainted region 26 of frame 18 was left exposed. The remainder of the surfaces of the door 14 are painted typically with a decorative coating, then fired or fused to complete the coating of paint on the door while at the same time permanently adhering the door 14 and the paint layer. The electrically conductive gasket 36 may be one of any of several types. Several types include carbon filled compressible rubber strips where the carbon particles provided the paths of continuity; or alternatively, a metal sphere or particle loading into the rubber matrix in such quantities that particles will be in contact with adjacent particles thus forming conductivity paths through the rubber gasket.

The flexible gasket 36 may be attached to the bare metal 38 with a metal clip, selective bonding to insure the conductive gasket remains in contact with the bare metal in the cover, provide a recess in the cover to press fit the gasket, or other means that provides a conductive path between the gasket and door.

When the door 14 is moved from its open to closed position the cabinet door 14 will assume a face-to-face closed position with frame 18. Electrical continuity provided by the hinges 16 in FIG. 4 is insufficient to reliably connect the door 14 to frame 18 for purposes of EMI/RFI shielding.

The electrically conductive foil 40 is illustrated in FIG. 2 with pressure sensitive adhesive strips 42 exploded away from the surface. Pressure sensitive adhesive strips 42 are positioned along the edges of foil 40 and may be of the type having a release sheet engaged with the exposed surfaces which may then be subsequently removed when the foil is to be applied.

The foil 40 is a high purity aluminum foil which will oxidize over time but where the oxidation will be insufficient to create a conductivity problem and introduce any significant resistance to the electrical surface between the door 14 and the cabinet frame 18. The foils is preferably of the type which is specified in ASTM STANDARD DESIGNATION B373-90. The foil should be dry annealed and 0 tempered.

An alternative embodiment is illustrated in FIG. 3 where the foil 40 has deposited thereon, around its periphery, beads of a pressure sensitive adhesive 44. The pressure sensitive adhesive in the case of FIG. 3 may be deposited from a dispenser or nozzle in a molten or semi-molten state and allowed to cool prior to positioning and application of the foil 40 to the frame 18. In the case of FIG. 2, the pressure sensitive adhesive may take the form of a tape 42 such as a double-face adhesive tape 42. The tape 42 need not be conductive nor need the adhesive component to be conductive inasmuch as the foil 40 will be relied upon for electrical continuity and the adhesive is only provided for positioning and retention.

Referring again to FIG. 4, foil 40 is shown positioned over the unpainted regions 26 on frame 18. Between the edges of the foil 40 and the painted portions of frame 18, resides the pressure sensitive adhesive strip 42 if the embodiment shown in FIG. 2 is utilized, or the bead of pressure sensitive adhesive material 44 in the case where the embodiment of FIG. 3 is utilized. This arrangement with the adhesive 42 or 44 between the inner surface of foil 40 and the painted region of frame 18 holds the foil 40 in position over the unpainted region 26 to provide protection to the raw steel portion 26 of frame 18. The foil 40 will retard rust and corrosion of the unpainted region 26.

When door 14 is closed to completely enclose the electronic system or computer within cabinet 10, the electrically conductive gasket 36 will be brought into face-to-face abutting relationship with foil 40 and its exterior surface. As the door is forced toward frame 18, the compression of the electrically conductive gasket 36 will provide a force which will displace foil 40 until its inner surface is in face-to-face abutment with the unpainted region 26 of frame 18. At this point, electrical continuity exists between door 14 through conductive gasket 36, foil 40 to the frame 18. Accordingly, any EMI/RFI which is received or picked up by door 14 will then be conducted through the metal of door 14 to the conductive gasket 36. Conductive gasket 36, being in intimate face-to-face engagement with foil 40, will then allow the electrical current generated by the EMI/RFI to be conducted directly to the foil 40 and then to frame 18 for grounding.

By utilizing a high purity, highly electrically conductive foil 40, an improved interface between the conductive gasket 36 and unpainted surface 26 of frame 18 is accomplished. The foil 40, under pressure from gasket 36, will conform to and engage the unpainted region 26 over a very large area thus reducing electrical resistance. Likewise, engagement of foil 40 with the conductive gasket 36 will be accomplished over a large area due to the pliability of foil 40 and the resilient and compressive nature of gasket 36.

While this particular embodiment of the invention has been described with respect to a cabinet 10 and a door 14, it is equally applicable for connecting the face panels or other frame portions of electronic assemblies with the frame 18. Where the frame 18 may be engaged by a portion of the electronic assembly inserted therein, the continuity between the outer frame member of the computer or electronic assembly may be similarly established. The electronic assembly may have attached to it a conductive gasket material, and the foil as described and shown in FIGS. 2 or 3 may be attached at strategic locations to the bare metal portion of the frame which would have been left unpainted for this purpose, thereby establishing continuity between the different shielding elements of the electronic assembly and the frame enclosure, adding further protection against EMI/RFI.

Figure 5:
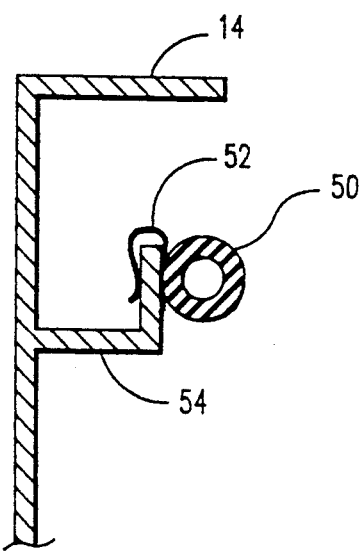
FIG. 5 is a sectional view of a door panel frame and a spring clip attached conductive gasket.

The elimination of an adhesive material from the area between the metal foil 40 and the exposed metal of the frame 18 improves the electrical conductivity between the foil 40 and the frame 18 by eliminating a substantial mass of material which is not conductive, as was practiced in the prior art. The electrically conductive particles which must be added to the adhesive material to provide conductivity greatly increases costs and tends to reduce the adhesion capability of the pressure sensitive adhesive since the area that the pressure sensitive adhesive engages, either the foil 40 or the frame 18 is reduced by the amount of physical contact between the conductive particle loading and either the foil 40 and the frame 18. Accordingly, adequate adhesion is also secured with a smaller area of adhesive by utilizing the described approach. Referring to FIG. 5, the gasket 50 may be attached to the door 14 by metal conductive spring clip 52. If the door 14 is fabricated of an extruded metal or sheet metal, a flange 54 may be formed into the door 14. The surface of the flange 54 is left unpainted for electrical continuity.

The invention described above may be modified or have changes made to it within the scope of the invention as defined by the attached claims.

I claim:

1. An EMI/RFI shield comprising:
   a metal fold strip having edges;
   a layer of pressure sensitive adhesive on one side of said metal foil strip, said adhesive being formed in at least two strips spaced apart from one another by a predetermined distance and disposed only proximate said strip edges;
   a metal enclosure for enclosing and containing electronic devices;

said foil strip disposed on said enclosure and said pressure sensitive adhesive adhesively engaged with both said foil strip and said enclosure;

said foil strip, said adhesive strips and said enclosure defining an adhesive free region with said foil strip and said enclosure juxtaposed for surface-to-surface contact.

2. The EMI/RFI shield of claim 1 wherein said pressure sensitive adhesive comprises a double face pressure sensitive adhesive tape.

3. The EMI/RFI shield of claim 1 wherein said pressure sensitive adhesive comprises a bead of pressure sensitive adhesive material deposited directly onto a surface of said foil strip.

4. The EMI/RFI shield of claim 2 wherein said tape further comprises additional pressure sensitive adhesive tape placed on said foil strip with portions of said additional tape closely proximate to said strips to provide adhesive proximate all edges of said foil strip.

5. The EMI/RFI shield of claim 3 wherein said tape further comprises additional beads of pressure sensitive adhesive material placed on said foil strip with portions of said additional beads closely proximate to said strips to provide adhesive proximate all edges of said foil strip.

* * * * *